United States Patent
Kelkar et al.

(10) Patent No.: US 8,648,634 B2
(45) Date of Patent: Feb. 11, 2014

(54) INPUT JITTER FILTER FOR A PHASE-LOCKED LOOP (PLL)

(75) Inventors: Ram Kelkar, South Burlington, VT (US); Faraydon Pakbaz, Milton, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/468,268

(22) Filed: May 10, 2012

(65) Prior Publication Data

US 2013/0300469 A1    Nov. 14, 2013

(51) Int. Cl.
*H03L 7/06* (2006.01)

(52) U.S. Cl.
USPC .......................................... 327/157; 327/148

(58) Field of Classification Search
USPC .......................................... 327/34, 146, 157
See application file for complete search history.

(56) References Cited

U.S. PATENT DOCUMENTS

| | | | |
|---|---|---|---|
| 5,155,380 A * | 10/1992 | Hwang et al. | 327/99 |
| 5,525,932 A * | 6/1996 | Kelkar et al. | 331/1 A |
| 5,869,944 A * | 2/1999 | Tanina | 318/599 |
| 6,064,235 A * | 5/2000 | Hayashi et al. | 327/2 |
| 6,333,678 B1 | 12/2001 | Brown et al. | |
| 6,388,531 B1 * | 5/2002 | Sirito-Olivier | 331/17 |
| 7,088,796 B2 | 8/2006 | Djahanshahi et al. | |
| 7,158,600 B2 | 1/2007 | Puccio et al. | |
| 7,205,806 B2 | 4/2007 | Chong et al. | |
| 7,386,286 B2 | 6/2008 | Petrovic et al. | |
| 7,586,378 B2 | 9/2009 | Welz et al. | |
| 7,697,067 B2 * | 4/2010 | Lim et al. | 348/540 |
| 7,750,704 B2 | 7/2010 | Maxim et al. | |
| 7,880,516 B2 | 2/2011 | Beaulaton et al. | |
| 8,374,075 B2 * | 2/2013 | Bogdan | 370/210 |
| 2006/0141963 A1 | 6/2006 | Maxim et al. | |
| 2006/0170821 A1 * | 8/2006 | Lim et al. | 348/500 |
| 2006/0239383 A1 * | 10/2006 | Wang et al. | 375/324 |
| 2008/0111633 A1 | 5/2008 | Cranford | |
| 2009/0039929 A1 | 2/2009 | Kossel | |
| 2009/0041104 A1 * | 2/2009 | Bogdan | 375/226 |
| 2009/0126490 A1 * | 5/2009 | Sameshima | 73/514.32 |
| 2010/0060333 A1 * | 3/2010 | Manku et al. | 327/157 |
| 2010/0117701 A1 | 5/2010 | Raghunathan et al. | |
| 2011/0115531 A1 | 5/2011 | Okamoto et al. | |
| 2011/0175642 A1 * | 7/2011 | Chen et al. | 326/21 |
| 2012/0063524 A1 * | 3/2012 | Stott et al. | 375/259 |
| 2012/0307923 A1 * | 12/2012 | Bogdan | 375/260 |

OTHER PUBLICATIONS

S. Balaji et al. "0.35μ, 1 GHz, CMOS Timing Generator Using Array of Digital Delay Lock Loops", 21st International Conference on Digital Object Identifier, 10.1109/VLSI.2008.95, pp. 613-618, 2008.

* cited by examiner

*Primary Examiner* — Adam Houston
(74) *Attorney, Agent, or Firm* — David Cain; Roberts Mlotkowski Safran & Cole P.C.

(57) ABSTRACT

An input jitter filter for a phase-locked loop and methods of use are provided. The method includes generating a masking zone around falling edges of a feedback signal. The method also includes determining that one or more outputs of a phase detector fall within the masking zone. The method further includes ignoring input clock noise when the one or more outputs of the phase detector fall within the masking zone.

18 Claims, 4 Drawing Sheets

US 8,648,634 B2

INPUT JITTER FILTER FOR A PHASE-LOCKED LOOP (PLL)

FIELD OF THE INVENTION

The invention relates to semiconductor structures and, more particularly, to an input jitter filter for a phase-locked loop and methods of use.

BACKGROUND

A phase-locked loop (PLL) is a control system that generates an output signal whose phase is related to the phase of an input "reference" signal. The PLL includes a phase detector (PD), a charge pump, a filter and a voltage-controlled oscillator (VCO), and two dividers in a feedback path. The PD compares falling edges of the clocks at its input and outputs two pulses to the filter, and a filter voltage controls the VCO. In this way, the PLL compares the phase of the input signal with the phase of the signals derived from the VCO, and adjusts the frequency of the VCO to keep the phases matched.

More specifically, the signal from the phase detector is used to control the VCO in a feedback loop. That is, when output pulses of the PD are unaligned, i.e., out of phase, the charge pump activates the VCO to compensate for the phase difference. To do this, the charge pump outputs a current pulse to pull a VCO frequency and/or phase up or down. More specifically, the charge pump outputs a current pulse whose direction, e.g., putting charge into the filter or taking charge out of the filter, depends on which output of the PD is wider. The current pulse flowing in the filter creates a voltage which then controls a VCO frequency.

An output of the VCO is divided to create an output clock as well as the feedback clock. Noise in the output clock is a function of noise in the input clock as well as PLL loop parameters, e.g., charge pump gains, filter values, etc. VCO noise also affects the output noise.

A critical design parameter is the PLL loop bandwidth which controls how much of the input clock noise and the VCO noise make it to the output. If the bandwidth is set high, more of the input noise comes through in the output, whereas at a lower bandwidth the output includes more VCO noise, which is very low at higher frequencies. Accordingly, it is beneficial to operate the PLL at higher bandwidths. However, in current PLL architectures, more input noise would also come through as a result because the input noise is multiplied by divider values. In this way, the effect of increasing the loop bandwidth is amplified by the divider values.

Accordingly, there exists a need in the art to overcome the deficiencies and limitations described hereinabove.

BRIEF SUMMARY

In an aspect of the invention, a method comprises generating a masking zone around falling edges of a feedback signal. The method also comprises determining that one or more outputs of a phase detector fall within the masking zone. The method further comprises ignoring input clock noise when the one or more outputs of the phase detector fall within the masking zone.

In an aspect of the invention, an input jitter filter comprises a first set of logic components connected to an output of a feedback divider and an output of a first delay block. The input jitter filter also comprises a second set of logic components connected to the output of the first delay block and an output of a second delay block. The input jitter filter further comprises a first logic component connected to an output of the first set of logic components and an output of the second set of logic components, and a second logic component connected to an output of the first logic component and one or more outputs of a phase detector.

In an aspect of the invention, a circuit comprises a phase detector connected to an input clock, and a pulse logic circuit connected to one or more outputs of the phase detector. The circuit also comprises a charge pump connected to one or more outputs of the pulse logic circuit. The circuit further comprises a filter connected to an output of the charge pump. The circuit comprises a voltage controlled oscillator (VCO) connected to an output of the filter, and one or more circuit components connected to an output of the VCO.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the input jitter filter for a phase-locked loop, which comprises the structures of the present invention. In still further embodiments, a method in a computer-aided design system is provided for generating a functional design model of the input jitter filter for a phase-locked loop. The method comprises generating a functional representation of the structural elements of the input jitter filter for a phase-locked loop.

BRIEF DESCRIPTION OF THE SEVERAL VIEWS OF THE DRAWINGS

The present invention is further described in the detailed description which follows, in reference to the noted plurality of drawings by way of non-limiting examples of exemplary embodiments of the present invention, in which like reference numerals represent similar parts throughout the several views of the drawings, and wherein.

DETAILED DESCRIPTION

The invention relates to semiconductor structures and, more particularly, to an input jitter filter for a phase locked loop (PLL) and methods of use. In embodiments, the PLL with an input jitter filter includes an input clock connected to a phase detector, and outputs of the phase detector are provided to a pulse logic. Outputs of the pulse logic are provided to a charge pump, and the charge pump is further connected to a filter. An output of the filter is connected to a voltage controlled oscillator (VCO) and, in embodiments, an output of the VCO is connected to a fast divider, which is further coupled to a slow divider. An output of the slow divider is provided to a first delay block and the pulse logic. An output of the first delay block is provided to the pulse logic, as a feedback signal, e.g., a feedback clock, to the phase detector, and as an input to a second delay block. An output of the second delay block is also provided to the pulse logic.

According to aspects of the present invention, the present invention advantageously ignores input clock noise, such that the loop bandwidth can be set as high as desired. In this way, the delay is user-settable, and thus, the noise filtering is user controlled. As a result, a user can shape the output noise to a desired performance of an application. Also, advantageously, the present invention compensates for additional sources of noise, e.g., random Gaussian noise. The present invention also produces a low noise, programmable frequency clock signal from a fixed frequency input clock. As a result, the present invention provides for increased loop bandwidth, such that the delay is set as needed to shape the output noise characteristic.

Figure 1:
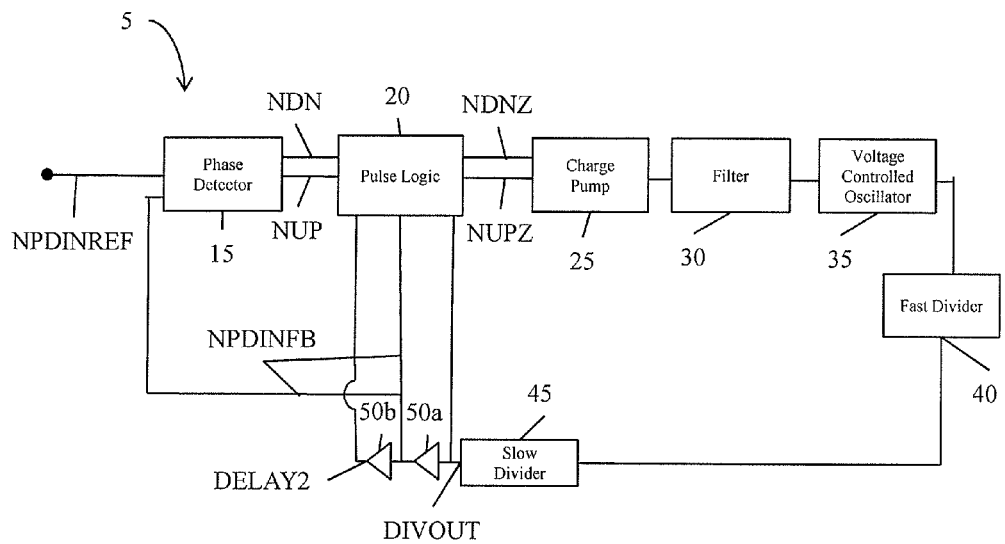
FIG. 1 shows a phase-locked loop in accordance with aspects of the present invention.

FIG. 1 shows a block diagram of a phase locked loop (PLL) with an input jitter filter in accordance with aspects of the invention. More specifically, the phase-locked loop (PLL) 5 includes an input clock NPDINREF connected to a phase detector 15, and outputs NDN, NUP of the phase detector 15 are provided to a pulse logic 20, e.g., the input jitter filter. Outputs NDNZ, NUPZ of the pulse logic 20 are provided to a charge pump 25. In embodiments, the pulse logic 20 takes the outputs NDN, NUP from the phase detector 15 and processes them to produce the outputs NDNZ, NUPZ, which control the charge pump 25. More specifically, in embodiments, the pulse logic 20 creates a masking zone, i.e., a window, around falling edges of a feedback signal NPDINFB, so that if a falling edge of the input clock NPDINREF is within the window, a phase difference between the feedback signal NPDINFB and the input clock NPDINREF is ignored. That is, a noise filter, i.e., the input jitter filter 20, is placed on the input clock NPDINREF such that the input clock noise is ignored by the PLL 5.

In embodiments, the charge 25 pump is further connected to a filter 30. An output of the filter 30 is connected to a voltage controlled oscillator (VCO) 35. An output of the VCO 35 is connected to a fast divider 40, and an output of the fast divider 40 is coupled to a slow divider 45. In embodiments, an output DIVOUT of the slow divider 45 is provided to a first delay block 50*a*. An output NPDINFB (which may also be referred to as the feedback signal NPDINFB) of the first delay block 50*a* is provided to a second delay block 50*b*, the pulse logic 20, and the phase detector 15. An output DELAY2 of the second delay block 50*b* is provided to the pulse logic 20. Thus, the output NPDINFB is delayed one time unit with respect to the output DIVOUT and the output DELAY2 is delayed two time units with respect to the output DIVOUT. In embodiments, the pulse logic 20 creates the masking zone around falling edges of the output NPDINFB. In embodiments, a width of the masking zone is user-settable through the delay blocks 50*a*, 50*b*. It should be understood by those of ordinary skill in the art that the above configuration of a PLL is for illustrative purposes only, and that other configurations are also contemplated by the present invention, e.g., the PLL may also include pre-dividers, single tone frequency estimators, etc.

Figure 2:
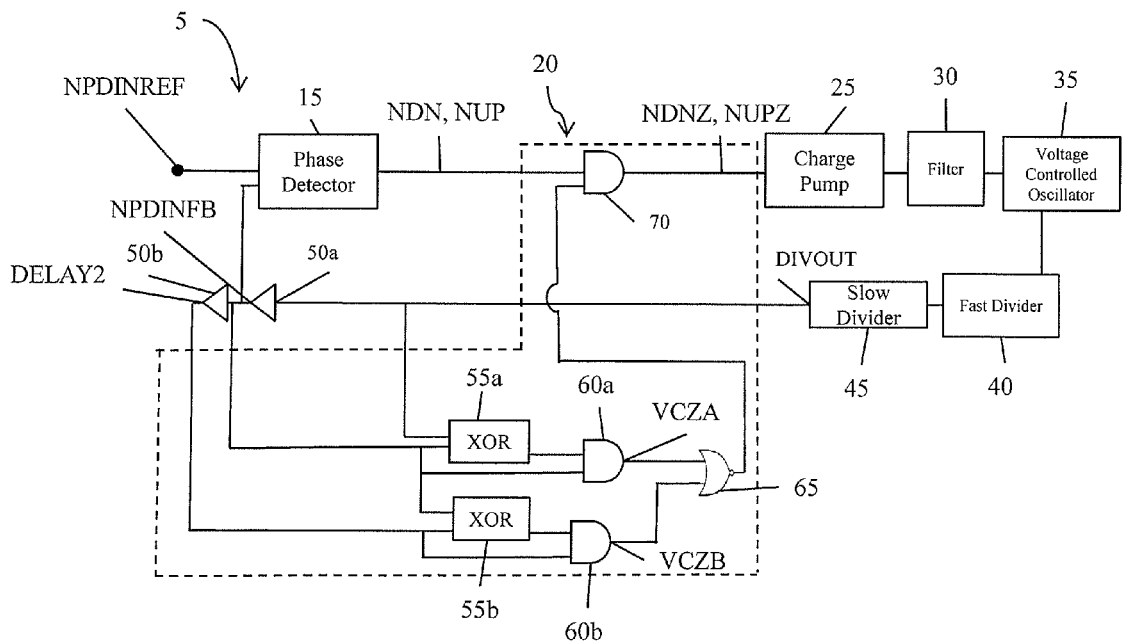
FIG. 2 shows an example pulse logic circuit in accordance with aspects of the present invention.

FIG. 2 shows an example of a pulse logic circuit in accordance with aspects of the invention. More specifically, in embodiments, the output DIVOUT of the slow divider 45 is provided as a first input to a first exclusive-or (XOR) gate 55*a* and to the first delay block 50*a*, which generates the feedback signal NPDINFB. In embodiments, the feedback signal NPDINFB is provided to the phase detector 15 as feedback and to the second delay block 50*b* as an input. Additionally, in embodiments, the feedback signal NPFINFB is provided as a second input to the first XOR gate 55*a*, as a first input to a second XOR gate 55*b*, and as a first input to a first AND gate 60*a*. In embodiments, an output of the first XOR gate is provided as a second input to the first AND gate 60*a*. In this way, the first AND gate 60*a* generates an output signal VCZA, which represents a backward falling edge of the masking zone. In embodiments, an output DELAY2 of the second delay block 50*b* is provided as a second input to the second XOR gate 55*b*. In embodiments, the output DELAY2 and an output of the second XOR gate 55*b* are provided as inputs to a second AND gate 60*b*. In this way, the second AND gate 60*b* generates an output signal VCZB, which represents a forward falling edge of the masking zone.

In embodiments, the signals VCZA and VCZB are provided to a NOR gate 65, which creates the masking zone, i.e., the window. An output of the NOR gate 65 and outputs NUP, NDN of the phase detector 15 are provided to an AND gate 70. In this way, the AND gate 70 can compare the output signals NUP, NDN with the signals VCZA, VCZB to determine if the falling edges of the output signals fall within the masking zone. In embodiments, when the falling edges of the output signals fall within the masking zone, the charge pump 25 does not activate the VCO 35, i.e., the charge pump 25 does not take any action to compensate for a phase difference. However, when the falling edges of the output signals are not within the masking zone, the charge pump 25 pulls the VCO 35 up or down to match the phase difference, i.e., the charge pump 25 takes action to compensate for the phase difference. More specifically, the charge pump 25 outputs a current pulse whose direction, e.g., putting charge into the filter or taking charge out of the filter, depends on whether NUP is wider than NDN (into the filter) or the reverse (out of the filter). In embodiments, the AND gate 70 generates output signals NUPZ, NDNZ. It should be understood by those of ordinary skill in the art that the above configuration of the pulse logic 20 is for illustrative purposes only, and that other configurations are also contemplated by the present invention.

Figure 3:
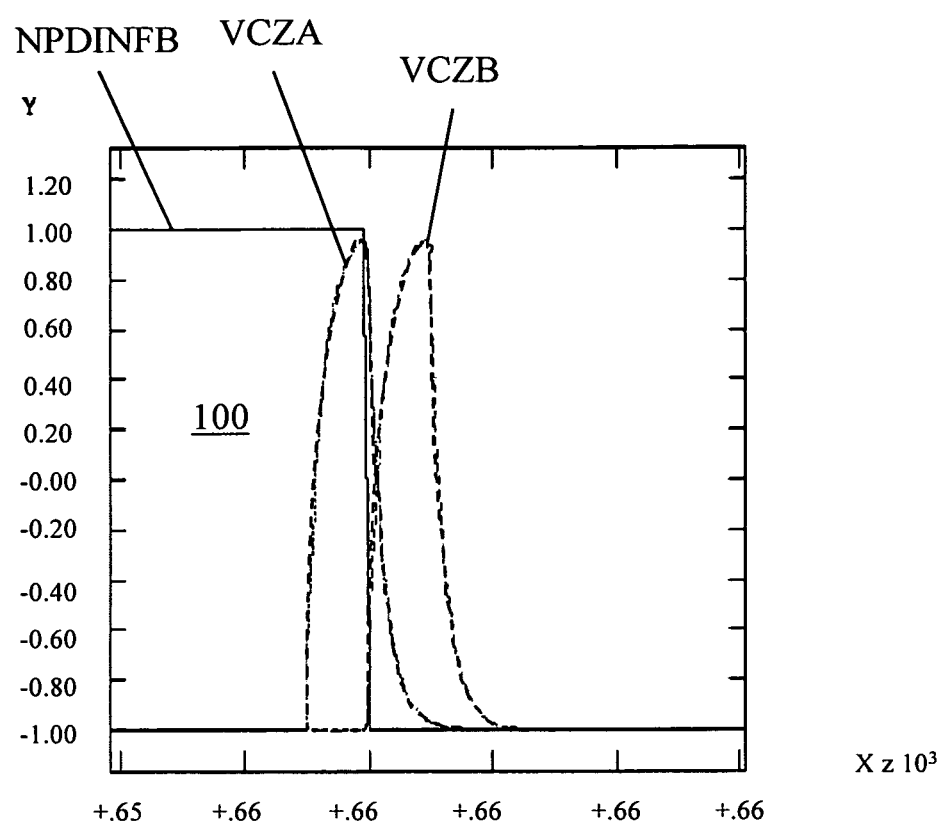
FIG. 3 shows a graph of a masking zone formed around a falling edge of the feedback signal in accordance with aspects of the present invention.

FIG. 3 shows a graph of a masking zone 100 formed around a falling edge of the feedback signal in accordance with aspects of the present invention. More specifically, FIG. 3 shows that the signals VCZA, VCZB lining up on either side of the falling edge of the feedback signal NPDINFB. In this way, the masking zone 100 is created around the falling edge of the feedback signal NPDINFB. In operation, when a phase difference falls within a width of the masking zone 100, the input clock NPDINREF moves around the masking zone 100 without activating the charge pump 25. In this way, any noise falling within the masking zone 100 is thus ignored. In contrast, when the phase difference exceeds the width of the masking zone 100, the charge pump 25 activates a VCO, e.g., the VCO 35 of FIG. 1, to compensate for the discrepancy. In contrast, in a conventional PLL, when the falling edges are unaligned, the charge pump activates the VCO to correct the phase difference.

Figure 4:
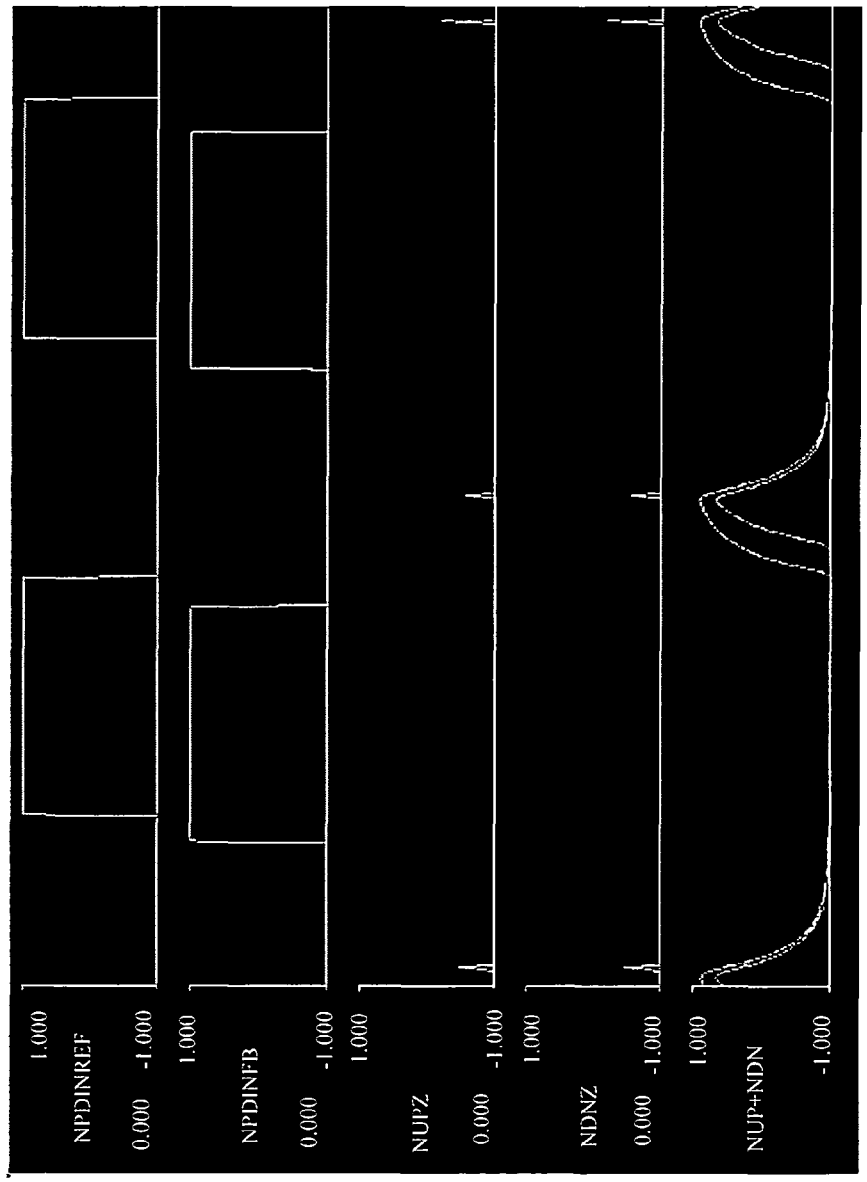
FIG. 4 shows a graph demonstrating an effect of using the input jitter filter in accordance with aspects of the present invention.

FIG. 4 shows a graph demonstrating an effect of using the input jitter filter in accordance with aspects of the present invention. More specifically, in FIG. 4, the input clock NPDINREF and the feedback signal NPDINFB are shown to be unaligned. In embodiments, although the input clock NPDINREF and output clock NPDINFB are not aligned, a charge pump, e.g., the charge pump 25 of FIG. 1, does not adjust a VCO, e.g., the VCO 35 of FIG. 1, to compensate for this discrepancy. This is because the output signals NUPZ, NDNZ of the pulse logic 20 are a logic 0. A signal NUP+NDN, i.e., the outputs of the PD superimposed on each other, shows a width difference which indicates that the signals input into the PD are not aligned, however, no action is taken to adjust the VCO frequency and/or phase difference in accordance with aspects of the present invention. That is, the charge pump 25 ignores the phase difference. FIG. 4 also shows the output of a phase detector, e.g., the phase detector 15 of FIG. 1, as the signal NUP+NDN. As a result, the phase detector 15 reports a phase difference of 0 between the signals the output signals NUPZ, NDNZ. Consequently, the phase difference is ignored by the PLL. That is, the charge pump does not compensate for the phase difference when the phase difference falls within the masking zone, as described herein.

Figure 5:
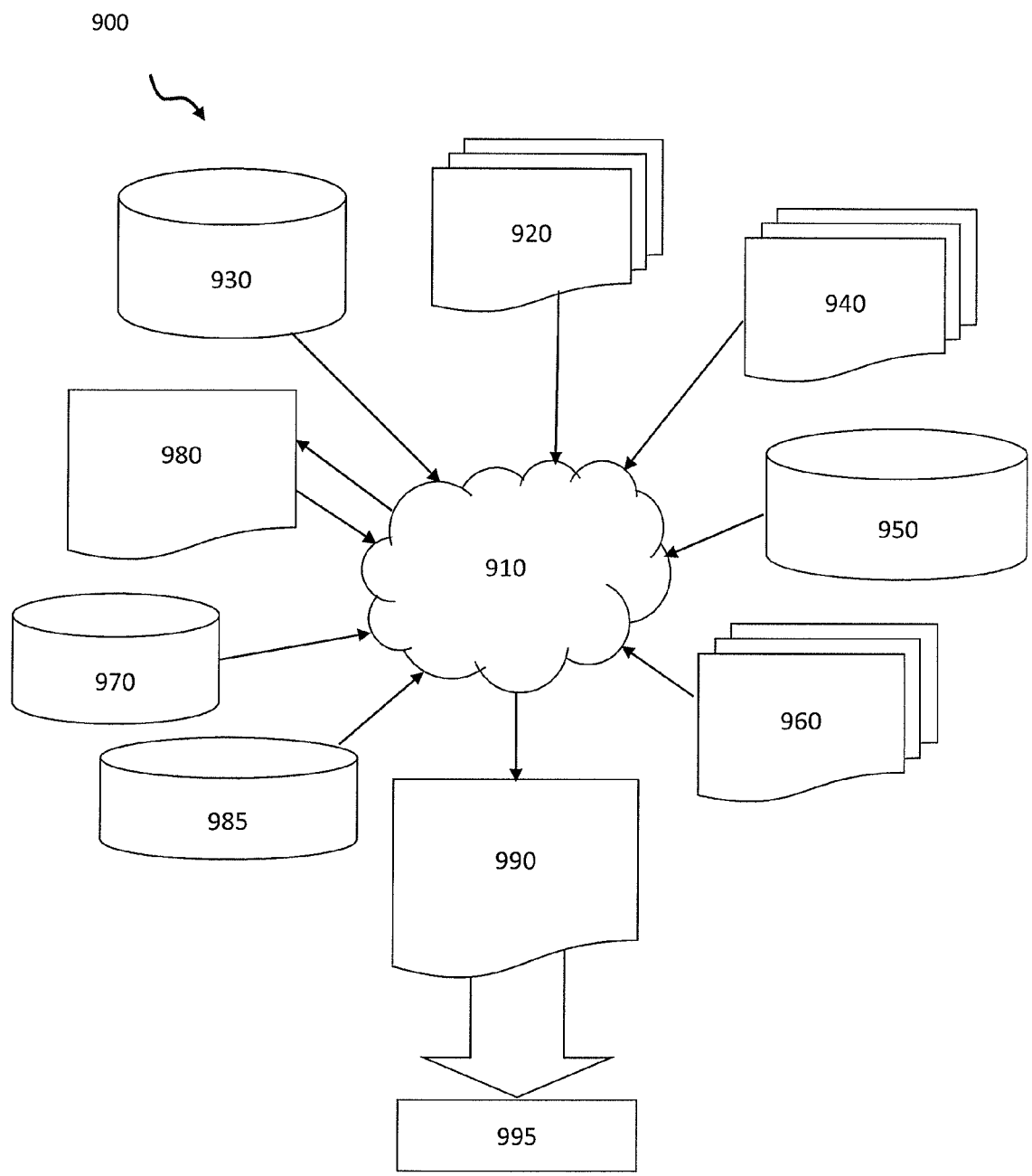
FIG. 5 is a flow diagram of a design process used in semiconductor design, manufacture, and/or test.

FIG. 5 is a flow diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
    generating a masking zone around falling edges of a feedback signal;
    determining that one or more outputs of a phase detector fall within the masking zone; and
    ignoring input clock noise when the one or more outputs of the phase detector fall within the masking zone.

2. The method of claim 1, further comprising:
    providing a backward falling edge of the masking zone; and
    providing a forward falling edge of the masking zone.

3. The method of claim 2, wherein:
    the backward falling edge is generated by:
        providing the feedback signal and an output of a feedback divider to a first exclusive-or (XOR) gate; and
        providing the feedback signal and an output of the first XOR gate to a first AND gate; and
    the forward falling edge is generated by:
        providing the feedback signal and an output of a delay block to a second XOR gate; and
        providing the output of the delay block and an output of the second XOR gate to a second AND gate.

4. The method of claim 3, wherein the generating the masking zone further comprises providing the backward falling edge and the forward falling edge to a NOR gate.

5. The method of claim 4, wherein the determining that the one or more outputs of the phase detector fall within the masking zone comprises comparing an output of the NOR gate and the one or more outputs of the phase detector using a third AND gate.

6. The method of claim 1, further comprising reporting a phase difference of 0 when the one or more outputs of the phase detector fall within the masking zone, such that a charge pump ignores the input clock noise.

7. The method of claim 1, further comprising activating a charge pump which adjusts a current of a voltage controlled oscillator to compensate for the input clock noise when the one or more outputs of the phase detector fall outside the masking zone.

8. The method of claim 1, further comprising adjusting a width of the masking zone using one or more delay blocks.

9. An input jitter filter, comprising:
    a first set of logic components connected to an output of a feedback divider and an output of a first delay block;
    a second set of logic components connected to the output of the first delay block and an output of a second delay block;
    a first logic component connected to an output of the first set of logic components and an output of the second set of logic components; and
    a second logic component connected to an output of the first logic component and one or more outputs of a phase detector,
    wherein:
        the first set of logic components creates a backward falling edge;
        the second set of logic components creates a forward falling edge; and
        the first logic component uses the backward falling edge and the forward falling edge to generate a masking zone around falling edges of a feedback signal.

10. An input jitter filter, comprising:
    a first set of logic components connected to an output of a feedback divider and an output of a first delay block;
    a second set of logic components connected to the output of the first delay block and an output of a second delay block;
    a first logic component connected to an output of the first set of components and an output of the second set of logic components; and
    a second logic component connected to an output of the first logic component and one or more outputs of a phase detector,
    wherein:
        the first logic component is a NOR gate;
        the second logic component is an AND gate;
        the first set of logic components comprises:
            an exclusive-or (XOR) gate; and an AND gate, wherein an output of the AND gate of the first set of logic components is provided to the NOR gate; and the second set of logic components comprises:
an XOR gate; and
an AND gate, wherein an output of the AND gate of the second set of logic components is provided to the NOR gate.

11. The input jitter filter of claim 9, wherein:
the first logic component is a NOR gate which creates the masking zone around the falling edges of the feedback signal; and
the second logic component is an AND gate which determines that the one or more outputs of the phase detector fall within the masking zone.

12. The input jitter filter of claim 11, wherein when the one or more outputs of the phase detector fall within the masking zone, the AND gate generates one or more output signals which direct a charge pump to ignore input clock noise.

13. The input jitter filter of claim 11, wherein when the one or more outputs of the phase detector fall outside the masking zone, the AND gate generates one or more output signals which activate a charge pump to adjust a current of a voltage controlled oscillator to compensate for input clock noise.

14. A circuit comprising:
a phase detector connected to an input clock;
a pulse logic circuit connected to one or more outputs of the phase detector;
a charge pump connected to one or more outputs of the pulse logic circuit;
a filter connected to an output of the charge pump;
a voltage controlled oscillator (VCO) connected to an output of the filter; and
one or more circuit components connected to an output of the VCO;
wherein:
the one or more circuit components comprise one or more feedback dividers;
an output of the one or more feedback dividers is provided to a first delay block and the pulse logic circuit;
an output of the first delay block is provided to the pulse logic circuit, the phase detector, and a second delay block; and
an output of the second delay block is provided to the pulse logic circuit.

15. The circuit of claim 14, wherein the pulse logic circuit comprises:
a first exclusive-or (XOR) gate connected to the output of the one or more feedback dividers and the output of the first delay block;
a second XOR gate connected to the output of the first delay block and the output of the second delay block;
a first AND gate connected to an output of the first XOR gate and the output of the first delay block; and
a second AND gate connected to an output of the second XOR gate and the output of the second delay block.

16. The circuit of 15, wherein the pulse logic circuit further comprises:
a NOR gate connected to an output of the first AND gate and an output of the second AND gate; and
a third AND gate connected to an output of the NOR gate and the one or more outputs of the phase detector.

17. The circuit of claim 16, wherein:
the first AND gate generates a backward falling edge of the masking zone;
the second AND gate generates a forward falling edge of the masking zone;
the NOR gate generates a masking zone around falling edges of a feedback signal of a phase-locked loop; and
the third AND gate determines that the one or more outputs of the phase detector fall within the masking zone.

18. The circuit of claim 17, wherein:
when the one or more outputs of the phase detector fall within the masking zone, the charge pump ignores input clock noise; and
when the one or more outputs of the phase detector fall outside of the masking zone, the charge pumps compensates for a phase difference by increasing or decreasing a current into the VCO.

* * * * *